United States Patent

Shimada

[11] Patent Number: 5,825,121
[45] Date of Patent: Oct. 20, 1998

[54] THIN FILM PIEZOELECTRIC DEVICE AND INK JET RECORDING HEAD COMPRISING THE SAME

[75] Inventor: Masato Shimada, Suwa, Japan

[73] Assignee: Seiko Epson Corporation, Tokyo, Japan

[21] Appl. No.: 499,020

[22] Filed: Jul. 6, 1995

[30] Foreign Application Priority Data

Jul. 8, 1994 [JP] Japan .................................. 6-157449

[51] Int. Cl.⁶ .................................................. H01L 41/08
[52] U.S. Cl. ........................ 310/358; 29/25.35; 310/330; 347/68
[58] Field of Search .................................... 310/358, 359, 310/328, 330–332; 252/62.9; 29/25.35; 347/68–72

[56] References Cited

U.S. PATENT DOCUMENTS

| | | | |
|---|---|---|---|
| 4,568,848 | 2/1986 | Ogawa | 310/358 X |
| 5,221,872 | 6/1993 | Nishida et al. | 310/358 |
| 5,295,288 | 3/1994 | Dam et al. | 310/328 X |
| 5,359,760 | 11/1994 | Busse et al. | 310/358 X |
| 5,430,344 | 7/1995 | Takeuchi et al. | 310/330 |

FOREIGN PATENT DOCUMENTS

| | | |
|---|---|---|
| 441408 | 8/1991 | European Pat. Off. . |
| 0455342 | 11/1991 | European Pat. Off. . |
| 484231 | 5/1992 | European Pat. Off. . |
| 62-161953 | 7/1987 | Japan . |
| 9216975 | 10/1992 | WIPO . |

OTHER PUBLICATIONS

Patent Abstract of Japan, vol. 012, No. 012, No. 005 (C–467), Jan. 8, 1988 (Matsushita Electric Ind. Co. Ltd.) 17 Jul. 1987.

Patent Abstracts of Japan, vol. 017, No. 342 (C–1076) 29 Jun. 1993, (Hitachi Ltd) 23 Feb. 1993.

Kumar, C.V.R. V. et al "Lead Zirconate . . . " Appl. Phys. Lett. 58(11) Mar. 18, 1991 American Institute of Physics pp. 1161–1163.

*Primary Examiner*—Mark O. Budd
*Attorney, Agent, or Firm*—Ladas & Parry

[57] ABSTRACT

The thin film piezoelectric device which has excellent properties is disclosed. A thin film piezoelectric device according to the present invention comprises a piezoelectric film which is polycrystalline, and two electrodes by which the piezoelectric film is sandwiched, wherein the size of crystal grains of the piezoelectric film substance is 0.4 $\mu$m or more and equal to or less than the thickness of the piezoelectric film. A process for producing the thin film piezoelectric device are also disclosed. The process comprising the steps of: forming the precursor film of a piezoelectric film on an electrode, first heating the electrode at a temperature of 500° to 700° C. to crystallize the precursor film, thereby obtaining a piezoelectric film which is polycrystalline, and secondly heating the electrode at a temperature of 750° to 1200° C. in an oxygen-containing atmosphere, thereby controlling the size of crystal grains of the piezoelectric film, observable from the surface of the piezoelectric film to 0.4 $\mu$m or more.

9 Claims, 3 Drawing Sheets

THIN FILM PIEZOELECTRIC DEVICE AND INK JET RECORDING HEAD COMPRISING THE SAME

BACKGROUND OF THE INVENTION

1. Field of the Invention

The present invention relates to a piezoelectric device of thin film type which can convert electric energy to mechanical energy, and vice versa. More specifically, the present invention relates to a piezoelectric device of thin film type which can be used for an actuator, a pressure sensor, a temperature sensor, an ink jet recording head, and the like.

2. Related Art

In general, the composition of a piezoelectric thin film is of a two-component system in which lead zirconate titanate (PZT) is a main component, or of a three-component system in which a third component is added to PZT.

However, we have never known such a precedent that attention was paid on the size of crystal grains contained in a thin film piezoelectric device and that the size of the crystal grains was controlled to the range as defined in the present invention.

For example, ferroelectrics in which PZT of a two-component system is used are disclosed in Applied Physics Letters, 1991, Vol. 58, No. 11, 1161–1163. Although this report discloses the properties of the ferroelectrics in detail, the evaluation of the properties of the ferroelectrics as piezoelectric devices are not conducted.

Further, Japanese Laid-Open Patent Publication No. 40035/1994 discloses a piezoelectric substance. However, it fails to describe the size of crystal grains contained in a film of the piezoelectric substance.

Furthermore, Journal of The American Ceramic Society, 1973, Vol. 56, No. 2, 91–96 also discloses a film of a piezoelectric substance. It is described that the size of crystal grains contained in this film, observable by a scanning electron microscope is approximately 1.7 to 7 micrometers.

SUMMARY OF THE INVENTION

We have now found that the properties of a thin film piezoelectric device are closely related to the size of crystal grains of a piezoelectric film, and established a process suitable for producing a thin film piezoelectric device in which crystal grains have a size in a specific range.

Accordingly, an object of the present invention is to provide a thin film piezoelectric device having excellent properties, and a process for producing the same.

The thin film piezoelectric device according to the present invention comprises a piezoelectric film which is polycrystalline, and two electrodes by which the piezoelectric film is sandwiched, wherein the size of crystal grains of the piezoelectric film is 0.4 μm or more and equal to or less than the thickness of the piezoelectric film.

The process for producing a thin film piezoelectric device according to the present invention comprises the step of forming the precursor film of a piezoelectric film on an electrode; heating as the first heating step the electrode on which the precursor film is formed at a temperature of 500° to 700° C. in an oxygen-containing atmosphere to crystallize the precursor film, thereby obtaining a piezoelectric film which is polycrystalline; and heating as the second heating step the electrode on which the piezoelectric film is formed at a temperature of 750° to 1200° C. in an oxygen-containing atmosphere, thereby controlling the size of crystal grains of the piezoelectric film, observable from the surface of the piezoelectric film to 0.4 μm or more.

DETAILED DESCRIPTION OF THE INVENTION

Thin Film Piezoelectric Device

Figure 1:
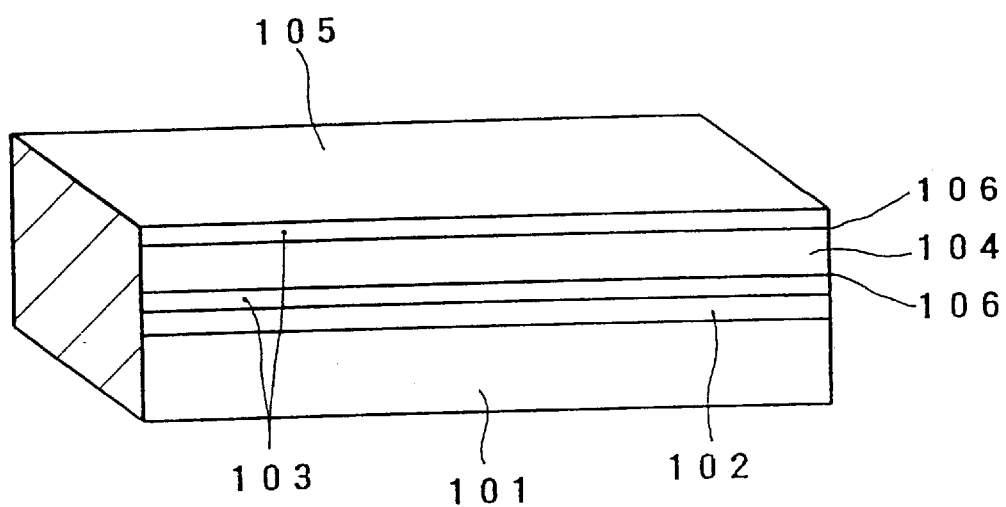
FIG. 1 is a perspective view showing the structure of a thin film piezoelectric device according to the present invention.

The thin film piezoelectric device of the present invention basically composed of a piezoelectric film which is polycrystalline, and two electrodes by which the piezoelectric film is sandwiched. The size of crystal grains contained of the piezoelectric film is 0.4 μm or more and equal to or less than the thickness of the piezoelectric film.

The size of crystal grains contained in the piezoelectric film can be that of crystal grains which are observed at the inside of the piezoelectric film. However, it is more convenient to observe the surface of the piezoelectric film to determine the size of crystal grains. This is because, according to the preferred embodiment of the present invention, crystal grains of the piezoelectric film are combined with each other tightly, so that there may be a case where the contour of the crystal grains is not clearly shown on the section of the piezoelectric film.

A piezoelectric device having excellent properties can be obtained when the size of crystal grains of the a piezoelectric film is controlled to 0.4 μm or more and equal to or less than the thickness of the piezoelectric film. It is known that the displacement amount of a piezoelectric device can be expressed by the following equation:

$$\text{Displacement Amount} = a \times d31 \times V = a \times E33 \times g31 \times V$$

wherein a represents a proportionality factor, d31 represents a piezoelectric constant, E33 represents a relative dielectric constant, g31 represents a voltage output factor, and V represents a voltage applied.

It has now confirmed that the piezoelectric constant d31 in this equation becomes high when the size of the crystal grains is controlled to 0.4 μm or more. Without intending to be bound by theory, it is believed that when the size of the crystal grains is controlled to the above value or more, the relative dielectric constant E33 is considered to become high. According to the preferred embodiment of the present invention, the thin film piezoelectric device of the invention has a piezoelectric constant d31 of 80 pC/N or more, preferably 150 pC/N or more.

According to the preferred embodiment of the present invention, the thickness of the piezoelectric film in the thin film piezoelectric device of the invention is approximately 1 to 5 μm.

It is preferable that the thin film piezoelectric device according to the present invention comprises a so-called two-component system in which lead zirconate titanate (PZT) is the main component. Specific examples of the composition of a two-component system include those represented by the following formula:

$$Pb(Zr_xTi_{1-x})O_3 + YPbO$$

wherein X and Y are $0.40 \leq X \leq 0.6$ and $0 \leq Y \leq 0.3$, respectively.

Further, the composition of the thin film piezoelectric device according to the present invention comprises a three-component system in which a third component, for example, lead niobate magnesium, is added to the PZT. Specific examples of the composition of a three-component system include those represented by the following formula:

$$PbTi_aZr_b(A_gB_h)_cO_3 + ePbO + (fMgO)_n$$

wherein

A represents a divalent metal selected from the group consisting of Mg, Co, Zn, Cd, Mn and Ni, or a trivalent metal selected from the group consisting of Sb, Y, Fe, Sc, Yb, Lu, In and Cr;

B represents a quinquevalent metal selected from the group consisting of Nb, Ta and Sb, or a sexivalent metal selected from the group consisting of W and Te; and a to h fulfill the following conditions:

a+b+c=1, $0.35 \leq a \leq 0.55$, $0.25 \leq b \leq 0.55$, $0.1 \leq c \leq 0.4$, $0 \leq e \leq 0.3$, $0 \leq f \leq 0.15c$, g=h=½, and n=o, provided that when A represents the trivalent metal, B does not represent sexivalent metal, and when A represents the divalent metal and B represents the quinquevalent metal, g is ⅓ and h is ⅔, and only when A is Mg and B is Nb, n is 1.

A more preferable specific example of the composition of a three-component system is one in which A represents Mg, B represents Nb, g is ⅓ and h is ⅔.

In the compositions, it is preferable that PbO be in the above ranges in order to make the crystal grains of the piezoelectric film large and dense. Further, when A is Mg and B is Nb, the presence of MgO prevents PbO from evaporating in the course of thermal treatment, and the reaction between PbO and a silicon substrate is also prevented. Furthermore, MgO stabilizes the perovskite structure which improves the piezoelectric properties.

In order to improve the piezoelectric properties, an extremely small amount of Ba, Sr, La, Nd, Nb, Ta, Sb, Bi, W, Mo, or Ca may also be incorporated into the piezoelectric film of either a two-component system or a three-component system. In particular, in the case of the three-component system, it is preferable to incorporate 0.10 mol % or less of Sr or Ba in order to improve the piezoelectric properties. Further, in the case of the three-component system, it is also preferable to incorporate 0.10 mol % or less of Mn or Ni in order to enhance the degree of sintering of the piezoelectric film.

The structure of the thin film piezoelectric device of the invention will now be specifically explained by referring to the accompanying drawings. The thin film piezoelectric device shown in FIG. 1 is composed of a silicon (Si) substrate 101, a thermally-oxidized Si film 102, a lower electrode 103 (made of, for example, Pt), a piezoelectric film 104, and an upper electrode 105 (made of, for example, Au). Further, according to the preferred embodiment of the present invention, an adhesive layer 106 made of, for example, Ti may be provided between the lower electrode 103 and the piezoelectric film 104, and between the upper electrode 105 and the piezoelectric film 104. The thickness of the piezoelectric film 104 is preferably about 0.5 to 25 μm, more preferably about 1 to 5 μm. The thickness of the other films and layers can be properly selected. However, for instance, the thickness of the Si substrate is preferably in the range of approximately 10 to 1,000 μm, that of the thermally-oxidized Si film is preferably in the range of approximately 0.05 to 3 μm, and those of the upper electrode and of the lower electrode are preferably in the range of approximately 0.05 to 2 μm.

Preparation of Thin Film Piezoelectric Device

The thin film piezoelectric device of the present invention can be produced by utilizing various conventional techniques for forming a thin film, although it is necessary to control the size of crystal grains of the piezoelectric film to 0.4 μm or more.

Sputtering may be preferably used for forming a thin film. Specifically, by using as a target a sintered PZT which is an essential component, the precursor film, which is amorphous, of a piezoelectric film is formed on an electrode film by means of sputtering.

Thereafter, the amorphous precursor film is crystallized and sintered by heating. It is preferable to conduct this heating treatment by two steps in an oxygen-containing atmosphere (for example, in oxygen, or in a mixed gas of oxygen and an inert gas such as argon). Specifically, in the first heating step, the amorphous precursor film is crystallized. In the second heating step, crystal grains produced are allowed to grow, and sintering between the crystal grains is promoted. Specifically, in the first heating step, the precursor film is heated at a temperature of preferably from 500° to 700° C. in an oxygen atmosphere. The precursor film is thus crystallized. This first heating step can be terminated when the precursor film is uniformly crystallized. Subsequently, in the second heating step, the crystallized film is heated at a temperature of 750° to 1200° C. This heating is continued until the size of the crystal grains becomes at least 0.4 μm. More preferably, the heating is continued until the crystal grains are tightly combined with each other.

The first and second heating steps can be conducted continuously. Alternatively, after the precursor film heated in the first heating step is cooled to room temperature, the second heating step is conducted.

In the first and second heating steps, any heating oven can be used as long as it can successfully attain the crystallization of the precursor film and the growth of the crystal grains. However, it is preferable to use a heating oven whose temperature can be raised at high speed. For example, a lamp relax oven is preferably used. The preferable rate of temperature rise is 50° C./sec or higher, more preferably 100° C./sec or higher in either heating step.

Another electrode is then provided on the piezoelectric film thus formed on the electrode, thereby obtaining a thin film piezoelectric device.

Ink Jet Recording Head Comprising Thin Film Piezoelectric Device

The thin film piezoelectric device of the present invention have various uses owing to the excellent properties thereof.

For instance, the thin film piezoelectric device of the present invention can be used as the piezoelectric transducer of an ink jet recording head. The use of the thin film piezoelectric device of the invention is advantageous in that an ink can be jetted at high pressure and that the recording head can be driven by high frequency.

Figure 2A:
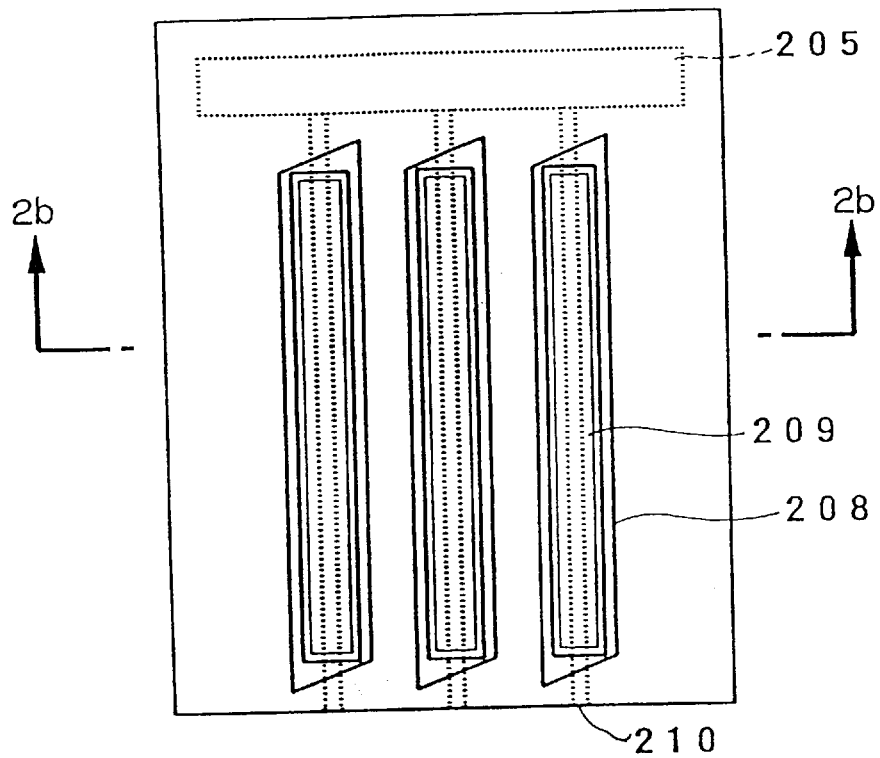
FIGS. 2(a) and 2(b) are illustrations showing the preferred structure of an ink jet recording head comprising the thin film piezoelectric device according to the present invention.
Figure 2B:
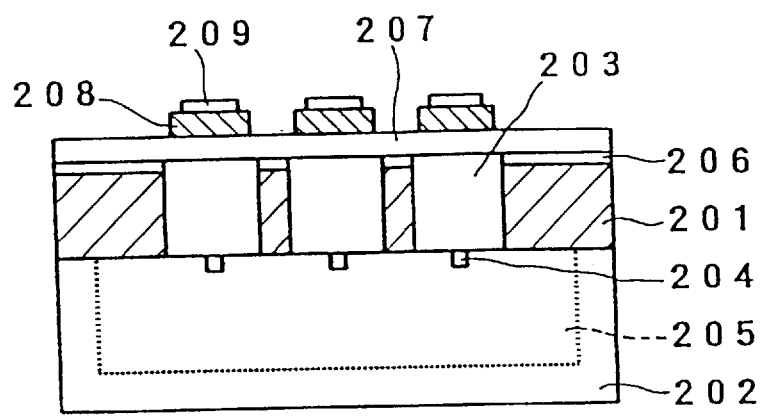

A specific example of the recording head in which the thin film piezoelectric device of the present invention is utilized is as shown in FIG. 2. FIG. 2(a) is a top view of the recording head, and FIG. 2(b) is a sectional view taken along line A–A' of FIG. 2(a). This recording head is prepared by connecting a chip which is a single-crystalline Si substrate 201 having cavities 203 to a glass substrate 202 on which ink channels 204 and an ink fountain 205 are provided. On the single-crystalline Si substrate 201, a thermally-oxidized Si film 206, a lower electrode 207, a piezoelectric film 208 and an upper electrode 209 are provided.

An ink is preserved in the ink fountain 205, and supplied to the cavities 203 through the ink channels 204. When voltage is applied to the piezoelectric film 208 through the lower electrode 207 and the upper electrode 209, the cavities 203 are deformed, so that pressure is applied on the ink contained in the cavities 203. The ink is jetted from nozzles 210 by this pressure applied, and ink jet recording is thus attained.

Figure 3:
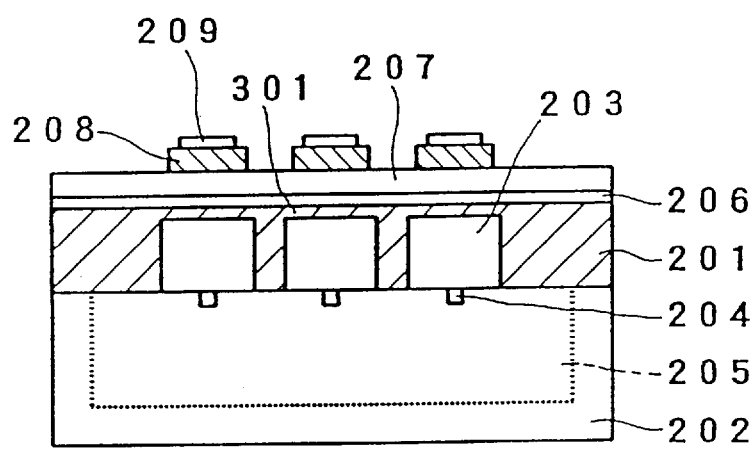
FIG. 3 is an illustration showing another preferred structure of an ink jet recording head comprising the thin film piezoelectric device according to the present invention.

Another preferred embodiment of the ink jet recording head is as shown in FIG. 3. In this embodiment, a single-crystalline Si substrate 201 exists also on top of cavities 203 as a thin-layered portion 301.

The present invention will now be explained more specifically by referring to the following examples. However, these examples are not intended to limit or restrict the scope of the present invention in any way.

EXAMPLE 1

A silicon substrate having a thickness of 400 $\mu$m and a diameter of 3 inches was washed with sulfuric acid, and then heated at 1000° C. for 4 hours in a oxygen atmosphere containing steam. Thus, the Si substrate was oxidized by wet process to form thereon a thermally-oxidized Si film having a thickness of 1 $\mu$m. On this film, a Ti film having a thickness of 200 angstrom, and a Pt film having a thickness of 2000 angstrom were continuously formed by the direct current magnetron sputtering method. The precursor film of a piezoelectric film, having a thickness of 3 $\mu$m was formed on the Pt film by the RF magnetron sputtering method in which a sintered PZT having a specific composition was used as a target. This precursor film was amorphous.

The Si substrate on which the precursor film had been formed was heated in a diffusion oven to crystallize and to sinter the precursor film, thereby obtaining a piezoelectric film. In this heating treatment, the Si substrate was heated at 550° C. in an oxygen atmosphere until crystal grains were produced in the precursor film (the first heating step), and then it was further heated at 750° C. in an oxygen atmosphere, whereby the crystal grains were grown and sintered (the second heating step). The time for the second heating step was adjusted so as to control the size of the crystal grains.

On the piezoelectric film, a Ti film having a thickness of 200 angstrom, and a Au film having a thickness of 2000 angstrom were continuously formed by the direct current magnetron sputtering method, whereby a thin film piezoelectric device was finally obtained.

The piezoelectric film thus obtained was found to have a composition represented by the formula Pb(Zr$_X$Ti$_{1-X}$)O$_3$+YPbO, in which X is 0.52 and Y is 0.05. Further, the surface of the piezoelectric film was observed by a scanning electron microscope to determine the size of crystal grains. The results are as shown in Table 1. The piezoelectric film was cut, and the section thereof was also observed by a scanning electron microscope. As a result, it was found that crystal grains at the inside of the film were so dense that they were not able to be recognized individually.

The thin film piezoelectric device obtained was subjected to polarization treatment. Specifically, a voltage of 60 V was applied between the Pt film and the Au film for 30 minutes. Thereafter, the piezoelectric constant d31 was measured. The results are as shown in Table 1.

TABLE 1

| Sample No. | Size of Crystal Grains($\mu$m) | d31 (pC/N) |
| --- | --- | --- |
| 1 | 0.02 | 18 |
| 2 | 0.33 | 25 |
| 3 | 0.45 | 85 |
| 4 | 0.60 | 95 |

EXAMPLE 2

A thin film piezoelectric device was prepared substantially in the same manner as in Example 1. It is noted that X and Y in the formula Pb(Zr$_X$Ti$_{1-X}$)O$_3$+YPbO, showing the composition of the piezoelectric film were changed as shown in Table 2. Further, the Si substrate on which the precursor film had been formed was heated, in the first heating step, at 550° C. until crystal grains were produced in the precursor film, and, in the second heating step, it was further heated at 800° C., whereby the crystal grains were grown and sintered. The time for the second heating step was so adjusted that the size of crystal grains observable from the surface of the piezoelectric film would be in the range of 0.4 to 1 $\mu$m.

The thin film piezoelectric device obtained was subjected to polarization treatment as in Example 1. Thereafter, the piezoelectric constant d31 was measured. The results are as shown in Table 2.

TABLE 2

| Sample No. | X | Y | d31(pC/N) |
| --- | --- | --- | --- |
| 1 | 0.35 | 0.05 | 20 |
| 2 | 0.40 | 0.40 | — |
| 3 | 0.40 | 0.00 | 80 |
| 4 | 0.45 | 0.20 | 90 |
| 5 | 0.50 | 0.10 | 85 |
| 6 | 0.60 | −0.10 | 5 |
| 7 | 0.55 | 0.30 | 80 |
| 8 | 0.55 | 0.20 | 85 |
| 9 | 0.60 | 0.30 | 80 |
| 10 | 0.60 | 0.10 | 80 |
| 11 | 0.65 | 0.40 | — |
| 12 | 0.65 | 0.10 | 15 |

With respect to Samples No. 2 and No. 11 shown in the table, the piezoelectric film peeled off the substrate in the course of the second heating step.

EXAMPLE 3

A thin film piezoelectric device was prepared substantially in the same manner as in Example 1. It is noted that a, b, c, e and f in the formula PbTi$_a$Zr$_b$(Mg$_{1/3}$Nb$_{2/3}$)$_c$O$_3$+ePbO+fMgO, showing the composition of the piezoelectric film were changed as shown in Table 3. Further, the Si substrate on which the precursor film had been formed was heated, in the first heating step, at 600° C. until crystal grains were produced in the precursor film, and, in the second heating step, it was further heated at 900° C., whereby the crystal grains were grown and sintered. The time for the second heating step was so adjusted that the size of crystal grains observable from the surface of the piezoelectric film would be in the range of 0.4 to 3 μm.

The thin film piezoelectric device obtained was subjected to polarization treatment as in Example 1. Thereafter, the piezoelectric constant d31 was measured. The results are as shown in Table 3.

TABLE 3

| Sample No. | a | b | c | e | f | d31(pC/N) |
|---|---|---|---|---|---|---|
| 1 | 0.60 | 0.20 | 0.20 | 0.10 | 0.05C | 50 |
| 2 | 0.60 | 0.25 | 0.15 | 0.10 | 0.07C | 55 |
| 3 | 0.60 | 0.30 | 0.10 | 0.10 | 0.00 | 50 |
| 4 | 0.55 | 0.25 | 0.20 | 0.15 | 0.10C | 155 |
| 5 | 0.55 | 0.35 | 0.10 | 0.00 | 0.10C | 160 |
| 6 | 0.55 | 0.35 | 0.10 | 0.30 | 0.00 | 40 |
| 7 | 0.55 | 0.40 | 0.05 | 0.10 | 0.00 | 40 |
| 8 | 0.50 | 0.20 | 0.30 | 0.10 | 0.10C | 25 |
| 9 | 0.50 | 0.30 | 0.20 | 0.10 | 0.15C | 170 |
| 10 | 0.50 | 0.35 | 0.15 | 0.30 | 0.07C | 175 |
| 11 | 0.45 | 0.25 | 0.30 | 0.10 | 0.00 | 180 |
| 12 | 0.45 | 0.30 | 0.25 | 0.15 | 0.00 | 185 |
| 13 | 0.45 | 0.30 | 0.25 | −0.05 | 0.20C | 20 |
| 14 | 0.45 | 0.35 | 0.20 | 0.05 | 0.05C | 200 |
| 15 | 0.45 | 0.35 | 0.20 | 0.35 | 0.00 | — |
| 16 | 0.45 | 0.40 | 0.15 | 0.10 | 0.00 | 185 |
| 17 | 0.45 | 0.40 | 0.15 | 0.10 | 0.13C | 70 |
| 18 | 0.40 | 0.30 | 0.30 | 0.20 | 0.03C | 205 |
| 19 | 0.40 | 0.30 | 0.30 | −0.05 | 0.03C | 55 |
| 20 | 0.40 | 0.35 | 0.25 | 0.20 | 0.20C | 210 |
| 21 | 0.40 | 0.40 | 0.20 | 0.15 | 0.10C | 185 |
| 22 | 0.40 | 0.40 | 0.20 | 0.10 | −0.05C | 110 |
| 23 | 0.40 | 0.45 | 0.10 | 0.10 | 0.07C | 155 |
| 24 | 0.40 | 0.55 | 0.05 | 0.10 | 0.20C | 65 |
| 25 | 0.35 | 0.20 | 0.45 | 0.10 | 0.02C | 30 |
| 26 | 0.35 | 0.25 | 0.40 | 0.00 | 0.10C | 170 |
| 27 | 0.35 | 0.35 | 0.30 | 0.00 | 0.10C | 175 |
| 28 | 0.35 | 0.35 | 0.30 | 0.50 | 0.03C | — |
| 29 | 0.35 | 0.40 | 0.25 | 0.05 | 0.08C | 160 |
| 30 | 0.35 | 0.45 | 0.20 | 0.05 | 0.10C | 155 |
| 31 | 0.35 | 0.55 | 0.10 | 0.10 | 0.00 | 150 |
| 32 | 0.30 | 0.25 | 0.40 | 0.05 | 0.07C | 70 |
| 33 | 0.30 | 0.30 | 0.40 | 0.05 | 0.25C | 65 |
| 34 | 0.30 | 0.40 | 0.30 | 0.05 | 0.07C | 70 |
| 35 | 0.30 | 0.50 | 0.20 | 0.05 | 0.10C | 70 |

With respect to Samples No. 15 and No. 28 shown in the table, the piezoelectric film peeled off the substrate in the course of the second heating step.

EXAMPLE 4

A thin film piezoelectric device was prepared substantially in the same manner as in Example 1 except that the conditions in the first and second heating steps were changed as shown in Table 4. It is noted that X and Y in the formula $Pb(Zr_xTi_{1-x})O_3 + YPbO$, showing the composition of the piezoelectric film were fixed to 0.45 and 0.10, respectively.

The first heating step was conducted at a temperature T1 (°C.) shown in Table 4, and the second heating step was conducted at a temperature T2 (°C.) shown in the table. It is noted that Sample No. 2 was subjected only to the first heating step which was conducted at 800° C. The first and second heating steps were conducted with the Si substrate cooled to room temperature therebetween ("discontinuous" in the table), or continuously conducted without cooling the substrate ("continuous" in the table).

The size of crystal grains observable from the surface of the thin film piezoelectric device obtained was as shown in Table 4.

Further, the thin film piezoelectric device was subjected to polarization treatment as in Example 1. Thereafter, the piezoelectric constant d31 was measured. The results are as shown in Table 4.

TABLE 4

| Sample No. | T1 (°C.) | T2 (°C.) | Continuous/ Discontinuous | Size of Crystsl Grains (μm) | d31(pC/N) |
|---|---|---|---|---|---|
| 1 | 600 | 750 | discontinuous | 0.4 | 90 |
| 2 | 800 | — | — | — | — |
| 3 | 600 | 800 | continuous | 0.5 | 90 |
| 4 | 450 | 800 | discontinuous | 0.5 | — |
| 5 | 500 | 1200 | discontinuous | 1.2 | 80 |
| 6 | 700 | 900 | discontinuous | 0.8 | 90 |
| 7 | 550 | 1000 | discontinuous | 1.0 | 80 |
| 8 | 600 | 700 | discontinuous | 0.3 | 50 |

The piezoelectric film of Sample No. 2 shown in the table peeled off the substrate in the course of the second heating step, and that of Sample No. 4 was cracked after the second heating step was completed.

EXAMPLE 5

A thin film piezoelectric device was prepared substantially in the same manner as in Example 1 except that the conditions in the first and second heating steps were changed as shown in Table 5. It is noted that a, b, c, e and f in the formula $PbTi_aZr_b(Mg_{1/3}Nb_{2/3})_cO_3 + ePbO + fMgO$, showing the composition of the piezoelectric film were fixed to 0.45, 0.45, 0.1, 0.1, and 0.01, respectively.

The first heating step was conducted at a temperature T1 (°C.) shown in Table 5, and the second heating step was conducted at a temperature T2 (°C.) shown in the table. It is noted that Sample No. 2 was subjected only to the first heating step which was conducted at 800° C. The first and second heating steps were conducted with the Si substrate cooled to room temperature therebetween ("discontinuous" in the table), or continuously conducted without cooling the substrate ("continuous" in the table). Samples Nos. 1 to 8 were heated in a diffusion oven, and Samples Nos. 9 and 10 were heated in a lamp relax oven in which high rate of temperature rise was attainable. Sample No. 9 was heated in the following manner: the sample was heated, in the first heating step, in an oxygen atmosphere by raising the temperature from room temperature to 550° C. with a rate of 100° C./sec, and then allowed to stand at 550° C. for 10 seconds. Thereafter, the sample was cooled to room temperature, and crystal grains on the surface of the sample were observed; the size of the crystal grains was found to be 0.3 μm. The sample was then subjected to the second heating step in which it was heated at 850° C. for one hour in an oxygen atmosphere. Sample No. 10 was heated in the following manner: the sample was heated, in the first heating step, in an oxygen atmosphere by raising the temperature from room temperature to 550° C. with a rate of 100° C./sec, and then allowed to stand at 550° C. for 10 seconds. Subsequently, the sample was further heated to 870° C. with a rate of 100° C./sec, and allowed to stand at the temperature for 10 seconds. Thereafter, it was cooled to 200° C. by natural cooling, and then taken out in the air. The sample was cooled to room temperature, and crystal grains on the surface of the sample were observed; the size of the crystal grains was found to be 0.3 μm. The sample was then subjected to the second heating step in which it was heated at 850° C. for one hour in an oxygen atmosphere.

The size of crystal grains observable from the surface of the thin film piezoelectric device obtained was as shown in Table 5.

Further, the thin film piezoelectric device was subjected to polarization treatment as in Example 1. Thereafter, the piezoelectric constant d31 was measured. The results are as shown in Table 5.

TABLE 5

| Sample No. | T1 (°C.) | T2 (°C.) | Continuous/ Discontinuous | Size of Crystsl Grains (μm) | d31(pC/N) |
|---|---|---|---|---|---|
| 1 | 600 | 750 | discontinuous | 1.0 | 200 |
| 2 | 800 | — | — | — | — |
| 3 | 550 | 800 | continuous | 1.0 | 205 |
| 4 | 450 | 750 | discontinuous | 2.0 | — |
| 5 | 500 | 1200 | discontinuous | 0.6 | 165 |
| 6 | 700 | 900 | discontinuous | 0.7 | 180 |
| 7 | 550 | 1000 | discontinuous | 0.5 | 165 |
| 8 | 600 | 700 | discontinuous | 0.3 | 65 |
| 9 | 550 | 850 | discontinuous | 1.2 | 215 |
| 10 | 550 | 870 + 850 | continuous | 1.5 | 220 |

The piezoelectric film of Sample No. 2 peeled off the substrate in the course of the second heating step, and that of Sample No. 4 was cracked after the second heating step was completed.

What is claimed is:

1. A thin film piezoelectric device comprising: a piezoelectric film which is polycrystalline, and two electrodes by which the piezoelectric film is sandwiched, wherein the size of crystal grains of the piezoelectric film is 0.4 μm to 3 μm and is equal to or less than the thickness of the piezoelectric film, and the piezoelectric film has a thickness of 1 μm to 5 μm.

2. An ink jet recording head comprising as a piezoelectric transducer a thin film piezoelectric device according to any one of claim 1.

3. The thin film piezoelectric device according to claim 1, wherein the piezoelectric film comprises lead zirconate titanate.

4. The thin film piezoelectric device according to claim 3, wherein the piezoelectric film has a composition represented by the following formula:

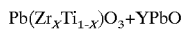

$Pb(Zr_xTi_{1-x})O_3 + YPbO$ wherein X and Y are $0.40 \leq X \leq 0.6$ and $0 \leq Y \leq 0.3$, respectively.

5. The thin film piezoelectric device according to claim 3, wherein the piezoelectric film further comprises a third component.

6. The thin film piezoelectric device according to claim 5, wherein the third component is lead niobate magnesium.

7. The thin film piezoelectric device according to claim 5, wherein the piezoelectric film has a composition represented by the following formula:

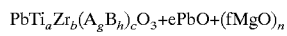

$PbTi_aZr_b(A_gB_h)_cO_3 + ePbO + (fMgO)_n$ wherein

A represents a divalent metal selected from the group consisting of Mg, Co, Zn, Cd, Mn and Ni, or a trivalent metal selected from the group consisting of Sb, Y, Fe, Sc, Yb, Lu, In and Cr;

B represents a quinquevalent metal selected from the group consisting of Nb, Ta and Sb, or a sexivalent metal selected from the group consisting of W and Te; and a to h fulfill the following conditions:

a+b+c=1, $0.35 \leq a \leq 0.55$, $0.25 \leq b \leq 0.55$, $0.1 \leq c \leq 0.4$, $0 \leq e \leq 0.3$, $0 \leq f \leq 0.15c$, g=h=½, and n=o, provided that when A represents the trivalent metal, B does not represent sexivalent metal, and when A represents the divalent metal and B represents the quinquevalent metal, g is ⅓ and h is ⅔, and only when A is Mg and B is Nb, n is 1.

8. The thin film piezoelectric device according to claim 7, wherein A represents Mg, B represents Nb, g is ⅓, and h is ⅔.

9. A method of ink jet recording comprising the step of generating and ejecting a droplet of an ink composition with the ink jet recording head according to claim 2.

* * * * *